(12) United States Patent
Toyoda

(10) Patent No.: US 11,289,670 B2
(45) Date of Patent: Mar. 29, 2022

(54) DISPLAY DEVICE AND METHOD OF MANUFACTURING DISPLAY DEVICE

(71) Applicant: Japan Display Inc., Minato-ku (JP)

(72) Inventor: Hironori Toyoda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/203,711

(22) Filed: Nov. 29, 2018

(65) Prior Publication Data

US 2019/0165295 A1 May 30, 2019

(30) Foreign Application Priority Data

Nov. 30, 2017 (JP) .............................. JP2017-230322

(51) Int. Cl.
| | |
|---|---|
| *H01L 51/50* | (2006.01) |
| *H01L 51/56* | (2006.01) |
| *H01L 51/52* | (2006.01) |
| *H01L 51/00* | (2006.01) |
| H01L 27/32 | (2006.01) |

(52) U.S. Cl.
CPC ........ *H01L 51/5092* (2013.01); *H01L 51/002* (2013.01); *H01L 51/5056* (2013.01); *H01L 51/5072* (2013.01); *H01L 51/5088* (2013.01); *H01L 51/5096* (2013.01); *H01L 51/5206* (2013.01); *H01L 51/5221* (2013.01); *H01L 51/56* (2013.01); H01L 27/3246 (2013.01); H01L 27/3276 (2013.01); H01L 2251/5346 (2013.01)

(58) Field of Classification Search
CPC .............. H01L 51/5056–5068; H01L 51/5088
See application file for complete search history.

(56) References Cited

U.S. PATENT DOCUMENTS

| | | | | |
|---|---|---|---|---|
| 6,166,488 | A * | 12/2000 | Arai ..................... | H01L 51/5012 313/503 |
| 9,368,744 | B2 * | 6/2016 | Lee ....................... | H01L 51/5004 |
| 2004/0232830 | A1 * | 11/2004 | Hieda .................. | H01L 51/5212 313/504 |
| 2004/0265630 | A1 * | 12/2004 | Suh ...................... | H01L 51/5052 428/690 |
| 2009/0256168 | A1 * | 10/2009 | Taneda ................ | H01L 27/3246 257/98 |
| 2009/0315452 | A1 * | 12/2009 | Lim ..................... | H01L 27/3211 313/504 |

(Continued)

FOREIGN PATENT DOCUMENTS

JP 2014-63829 4/2014

*Primary Examiner* — Mohammad M Hoque
(74) *Attorney, Agent, or Firm* — Oblon, McClelland, Maier & Neustadt, L.L.P.

(57) ABSTRACT

A display device according to an embodiment of the present invention includes: a substrate; a lower electrode provided above the substrate; an insulating film provided above the lower electrode and having an opening; an organic layer arranged at least partly in the opening and electrically connected to the lower electrode; and an upper electrode electrically connected above the organic layer; the organic layer includes a hole injection layer, the opening includes a first area arranged to a center side, and a second area arranged on an outer side of the first area, and the hole injection layer has a higher p-dopant concentration in the first area than in the second area.

5 Claims, 6 Drawing Sheets

(56) References Cited

U.S. PATENT DOCUMENTS

| | | | |
|---|---|---|---|
| 2010/0051912 A1* | 3/2010 | Gregory | H01L 27/3246 257/40 |
| 2010/0252857 A1* | 10/2010 | Nakatani | H01L 51/0029 257/100 |
| 2012/0168725 A1* | 7/2012 | Lin | H01L 51/5088 257/40 |
| 2013/0001541 A1* | 1/2013 | Hayashi | C09K 11/025 257/40 |
| 2013/0126842 A1* | 5/2013 | Takeuchi | H01L 51/5088 257/40 |
| 2014/0077198 A1 | 3/2014 | Kashiwabara | |
| 2014/0127846 A1* | 5/2014 | Yamada | H01L 51/5088 438/46 |
| 2014/0147952 A1* | 5/2014 | Yamada | H01L 51/5234 438/46 |
| 2014/0183494 A1* | 7/2014 | Kam | H01L 51/5088 257/40 |
| 2016/0155978 A1* | 6/2016 | Park | H01L 51/56 257/40 |
| 2016/0248030 A1* | 8/2016 | Zhang | H01L 51/506 |
| 2017/0069790 A1* | 3/2017 | Choi | H01L 33/16 |
| 2018/0151825 A1* | 5/2018 | Choi | H01L 27/3216 |
| 2019/0013492 A1* | 1/2019 | Jankus | H01L 51/56 |
| 2019/0157601 A1* | 5/2019 | Hou | H01L 51/0005 |
| 2019/0165138 A1* | 5/2019 | Tsai | H01L 21/02617 |
| 2019/0363272 A1* | 11/2019 | Tsukamoto | G09F 9/30 |
| 2019/0363276 A1* | 11/2019 | Li | H01L 51/5072 |
| 2020/0258949 A1* | 8/2020 | Li | H01L 51/506 |
| 2021/0043679 A1* | 2/2021 | Ueda | H01L 33/26 |
| 2021/0083196 A1* | 3/2021 | Galan | H01L 51/0067 |
| 2021/0202632 A1* | 7/2021 | Yoon | H01L 51/5056 |

\* cited by examiner

DISPLAY DEVICE AND METHOD OF MANUFACTURING DISPLAY DEVICE

CROSS-REFERENCE TO RELATED APPLICATION

The present application claims priority from Japanese application JP2017-230322 filed on Nov. 30, 2017, the content of which is hereby incorporated by reference into this application.

BACKGROUND OF THE INVENTION

1. Field of the Invention

The present invention relates to a display device and a method of manufacturing a display device.

2. Description of the Related Art

A flat panel display such as an organic electroluminescence display device has a display panel in which a thin-film transistor and an organic light-emitting diode or the like provided for each pixel are formed on a substrate.

JP2014-63829A discloses an organic electroluminescence display device in which an organic layer is arranged between the anode and the cathode. This organic layer includes a hole injection layer, a hole transport layer, a light-emitting layer and the like.

SUMMARY OF THE INVENTION

However, the related-art configuration has a problem in that luminance varies within the pixel. That is, in the related-art configuration, for example, the hole transport layer or the like included in the organic layer is provided in an opening provided in an insulating film, which is generally called bank. To form the hole transport layer in the opening, a vapor deposition process using a mask is applied. In this process, depending on the thickness of the mask, the thickness distribution of the hole transport layer differs between a center area of a mask opening and an edge area of the mask opening. That is, the presence of the inner surface of the mask obstructs the vapor deposition of the hole transport layer and therefore may cause the hole transport layer to be thinner in the edge area of the mask opening than in the center area of the mask opening. Consequently, a current tends to flow more easily in the edge area where the hole transport layer is thinner, thus causing variation in luminance within the pixel.

In view of the foregoing problem, an object of the invention is to restrain variation in luminance within the pixel.

(1) A display device according to an embodiment of the present invention includes: a substrate; a lower electrode provided above the substrate; an insulating film provided above the lower electrode and having an opening; an organic layer arranged at least partly in the opening and electrically connected to the lower electrode; and an upper electrode electrically connected above the organic layer; the organic layer includes a hole injection layer, the opening includes a first area arranged to a center side, and a second area arranged on an outer side of the first area, and the hole injection layer has a higher p-dopant concentration in the first area than in the second area.

(2) In the display device as described in (1) above, the organic layer includes a first layer, and the first layer has a greater thickness in the first area than in the second area.

(3) In the display device as described in (1) above, the organic layer includes a hole transport layer, and the hole transport layer has a greater thickness in the first area than in the second area.

(4) In the display device as described in (1) above, the hole injection layer is provided from the opening to an upper surface of the insulating film.

(5) In the display device as described in (1) above, the hole injection layer includes: a first hole injection layer provided in the first area in the opening; and a second hole injection layer provided in the second area in the opening, and the first hole injection layer has a higher p-dopant concentration than the second hole injection layer.

(6) A method of manufacturing a display device according to an embodiment of the present invention includes: preparing a substrate; forming a lower electrode above the substrate; forming an insulating film having an opening, above the lower electrode; forming an organic layer arranged at least partly in the opening and electrically connected to the lower electrode; and forming an upper electrode electrically connected above the organic layer; wherein the forming the organic layer includes forming a hole injection layer, the opening includes a first area arranged to a center side, and a second area arranged on an outer side of the first area, and in the forming the hole injection layer, the hole injection layer is formed in such a way as to have a higher p-dopant concentration in the first area than in the second area.

(7) In the method of manufacturing a display device as described in (6) above, the organic layer includes a first layer, and in the forming the organic layer, the first layer is formed in such a way as to have a greater thickness in the first area than in the second area.

(8) In the method of manufacturing a display device as described in (6) above, the organic layer includes a hole transport layer, and in the forming the organic layer, the hole transport layer is formed in such a way as to have a greater thickness in the first area than in the second area.

(9) In the method of manufacturing a display device as described in (6) above, in the forming the hole injection layer, the hole injection layer is formed from the opening to an upper surface of the insulating film.

(10) In the method of manufacturing a display device as described in (6) above, the forming the hole injection layer includes: forming a first hole injection layer in the first area in the opening; and forming a second hole injection layer in the second area in the opening, and the first hole injection layer formed in the forming the first hole injection layer has a higher p-dopant concentration than the second hole injection layer formed in the forming the second hole injection layer.

(11) In the method of manufacturing a display device as described in (6) above, the forming the hole injection layer includes: forming the hole injection layer at least in the opening; and additionally doping the hole injection layer arranged in the first area in the opening with a p-dopant.

(12) In the method of manufacturing a display device as described in (6) above, the forming the hole injection layer includes: forming the hole injection layer at least in the opening; and additionally doping the hole injection layer in the opening with a p-dopant, and in the additionally doping with the p-dopant, the hole injection layer arranged in the first area in the opening has a greater amount of doping with the p-dopant than the hole injection layer arranged in the second area in the opening.

DETAILED DESCRIPTION OF THE INVENTION

First Embodiment

Figure 1:
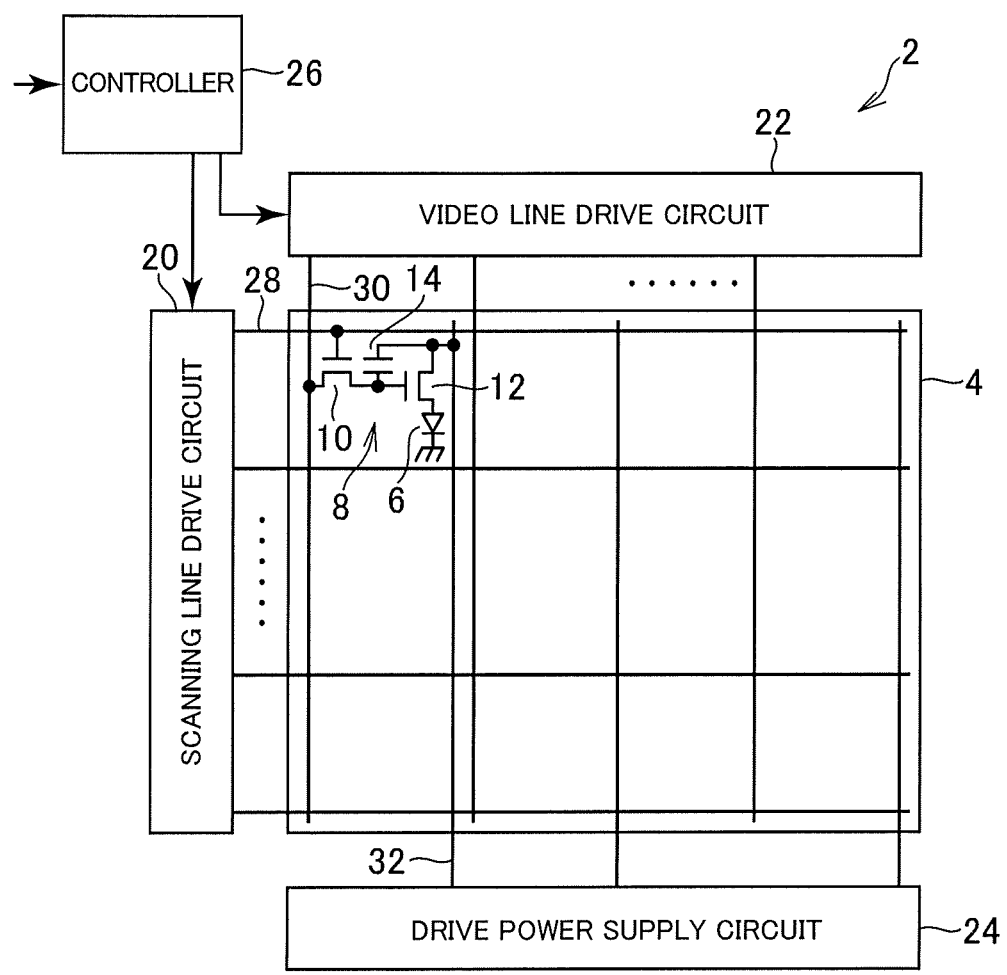
FIG. 1 is a schematic view showing a schematic configuration of a display device according to an embodiment.

Hereinafter, an embodiment of the invention will be described with reference to the drawings.

The disclosed embodiments merely examples, and appropriate variations within the spirit of the present invention that can be easily arrived at by those skilled in the art are naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate. Further, unless otherwise noted, embodiments of the invention can be combined with each other.

A display device 2 according to this embodiment is, for example, an organic electroluminescence display device and installed in a television, personal computer, mobile terminal, mobile phone or the like. FIG. 1 is a schematic view showing a schematic configuration of the display device 2 according to this embodiment. The display device 2 has a pixel array unit 4 which displays an image, and a drive unit which drives the pixel array unit 4. The display device 2 may have a base member made up of glass or the like. The display device 2 may be a flexible display having flexibility. In such a case, the display device 2 may have a base member made of a flexible resin film. The display device 2 has a wiring layer including a wiring provided inside or above the base member.

In the pixel array unit 4, an organic light-emitting diode 6 and a pixel circuit 8 are arranged in the form of a matrix corresponding to pixels. The pixel circuit 8 includes a lighting thin-film transistor 10, a drive thin-film transistor 12, and a capacitor 14 or the like.

Meanwhile, the drive unit includes a scanning line drive circuit 20, a video line drive circuit 22, a drive power supply circuit 24, and a controller 26. The drive unit drives the pixel circuit 8 and controls the light emission of the organic light-emitting diode 6.

The scanning line drive circuit 20 is connected to a scanning signal line 28 provided for each horizontal array of pixels (pixel row). The scanning line drive circuit 20 selects each scanning signal line 28 in order in response to a timing signal inputted from the controller 26 and applies a voltage to the selected scanning signal line 28 to turn on the lighting thin-film transistor 10.

The video line drive circuit 22 is connected to a video signal line 30 provided for each vertical array of pixels (pixel column). The video line drive circuit 22 has a video signal inputted from the controller 26 and outputs to each video signal line 30 a voltage corresponding to the video signal for the selected pixel row according to the selection of the scanning signal line 28 by the scanning line drive circuit 20. The voltage is written into the capacitor 14 via the lighting thin-film transistor 10 in the selected pixel row. The drive thin-film transistor 12 supplies a current corresponding to the written voltage, to the organic light-emitting diode 6. This causes the organic light-emitting diode 6 of the pixel corresponding to the selected scanning signal line 28 to emit light.

The drive power supply circuit 24 is connected to a drive power supply line 32 provided for each pixel column and supplies a current to the organic light-emitting diode 6 via the drive thin-film transistor 12 in the selected pixel row and the drive power supply line 32.

Here, a lower electrode, which is the lower electrode of the organic light-emitting diode 6, is connected to the drive thin-film transistor 12. Meanwhile, an upper electrode, which is the upper electrode of each organic light-emitting diode 6, is formed of an electrode that is common among the organic light-emitting diodes 6 of all the pixels. If the lower electrode is formed as the anode, a high electric potential is inputted thereto, and the upper electrode is the cathode, to which a low electric potential is inputted. If the lower electrode is formed as the cathode, a low electric potential is inputted thereto, and the upper electrode is the anode, to which a high electric potential is inputted.

Figure 2:
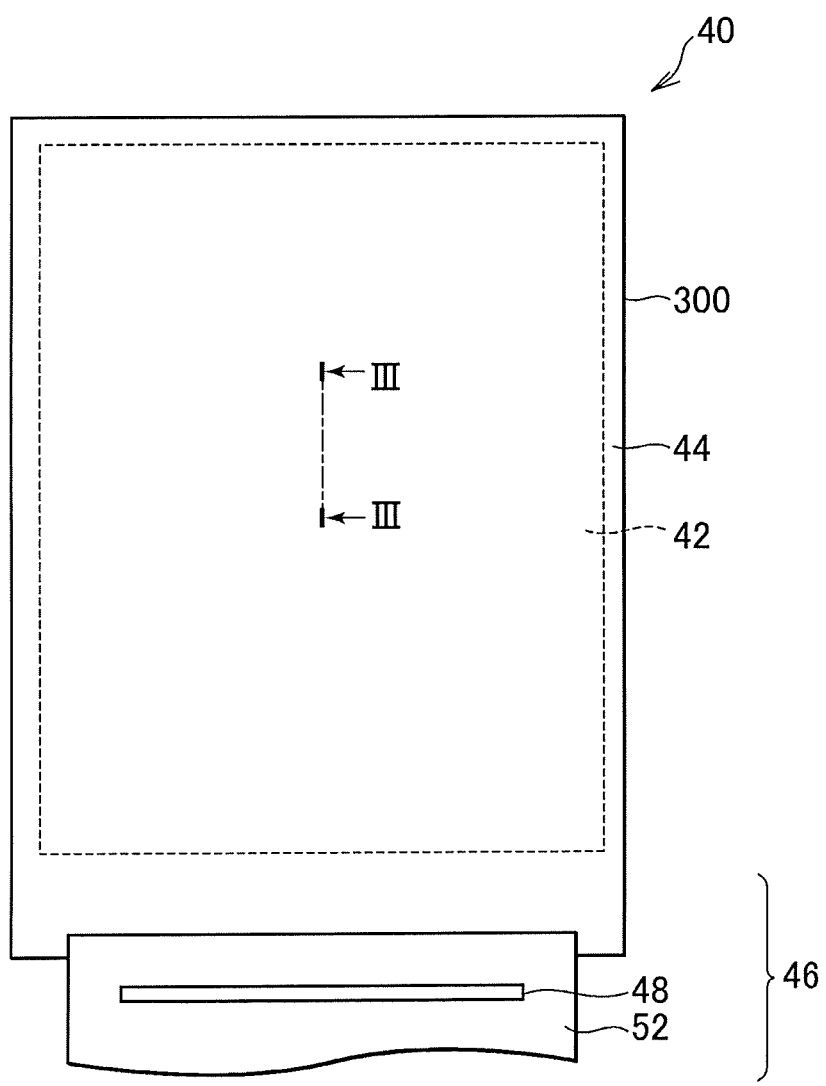
FIG. 2 is a schematic plan view showing a display panel in the display device according to the embodiment.

FIG. 2 is a schematic plan view showing a display panel 40 in this embodiment. The display panel 40 has a display area 42 where the organic light-emitting diode 6 provided in the pixel array unit 4 is arranged, and a frame area 44 arranged on the outer side of the display area 42. Here, the upper electrode of the organic light-emitting diode 6 is formed in almost the entirety of the display area 42. That is, the upper electrode is arranged over a plurality of pixels.

As shown in FIG. 2, a flexible printed circuit board 52 is connected to an organic light-emitting diode structure layer 300 including the organic light-emitting diode 6. On the flexible printed circuit board 52, a driver integrated circuit 48 forming the drive unit is loaded. The flexible printed circuit board 52 is connected to the scanning line drive circuit 20, the video line drive circuit 22, the drive power supply circuit 24, and the controller 26 or the like.

Figure 3:
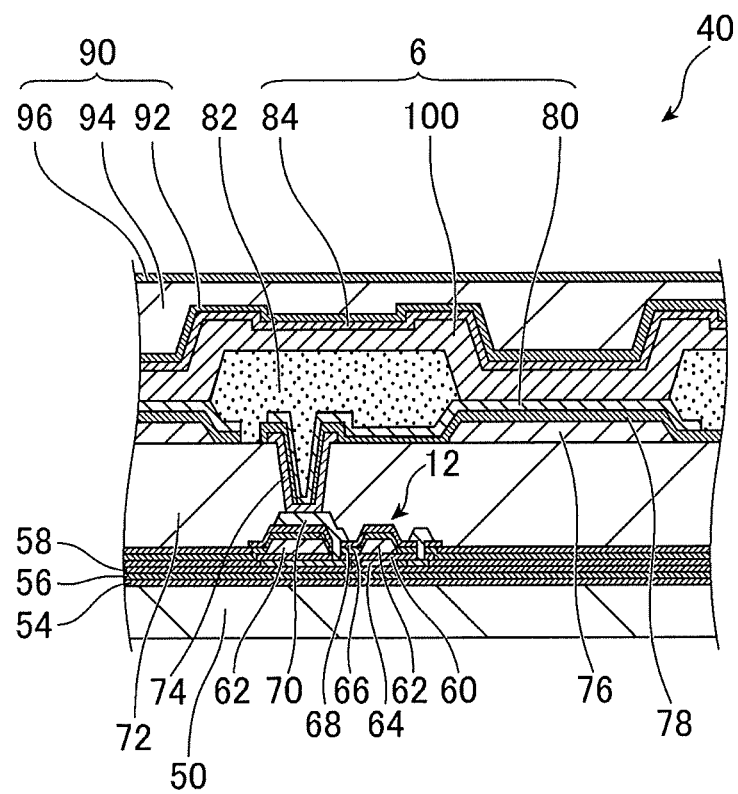
FIG. 3 is a schematic vertical cross-sectional view showing the display panel, taken along shown in FIG. 2.

FIG. 3 is a schematic vertical cross-sectional view showing the display panel 40, taken along shown in FIG. 2. As shown in FIG. 3, the display panel 40 according to this embodiment has an array substrate 50. In this embodiment, polyimide is used as the material forming the array substrate 50. Also, another resin material may be used as the material forming the array substrate 50.

Above the array substrate 50, a three-film structure including a first silicon oxide film 54, a first silicon nitride film 56 and a second silicon oxide film 58 is provided as an undercoat film. The first silicon oxide film 54, which is the lowermost film, is provided to improve adhesion to the array substrate 50. The first silicon nitride film 56, which is the middle film, is provided as a block film against moisture and impurities from outside. The second silicon oxide film 58, which is the uppermost film, is provided as a block film which prevents hydrogen atoms contained in the first silicon nitride film 56 from being diffused to the semiconductor film side. Incidentally, the undercoat film is not particularly limited to this structure and may be a structure having more films stacked or may be a single-film structure or two-film structure.

Above the undercoat film, the drive thin-film transistor 12 is provided. The drive thin-film transistor 12 has a structure in which a low-concentration impurity region is provided between a channel region and source and drain regions. In this embodiment, a silicon oxide film is used as a gate insulating film 60, and a first wiring 62 made up of a multilayer structure of Ti and Al is used as a gate electrode. The first wiring 62 also functions as a retention capacitance line in addition to the function as the gate electrode of the drive thin-film transistor 12. That is, the first wiring 62 is used to form a retention capacitance with a polysilicon film 64.

Above the drive thin-film transistor 12, a second silicon nitride film 66 and a third silicon oxide film 68 as interlayer insulating films are stacked. Also, a second wiring 70, forming source and drain electrodes and a lead wiring, is formed. In this embodiment, the second wiring 70 has a three-film structure of Ti, Al and Ti. An electrode formed by an electrically conductive film in the same film as the interlayer insulating films and the first wiring 62 and an electrode formed by an electrically conductive film in the same film as the source and drain wirings of the drive thin-film transistor 12 form a retention capacitance. The lead wiring extends to an end part on the peripheral edge of the array substrate 50 and forms a terminal for connecting the flexible printed circuit board 52 and the driver integrated circuit 48 shown in FIG. 2.

Above the drive thin-film transistor 12, a flattening film 72 is formed. As the flattening film 72, an organic material such as photosensitive acrylic is often used. The flattening film 72 has higher surface flatness than an inorganic insulating material formed by a CVD (chemical vapor deposition) method or the like.

The flattening film 72 is removed at a pixel contact part where the drive thin-film transistor 12 and a lower electrode 80 included in the organic light-emitting diode 6 are electrically connected to each other and at an end part of the frame area 44. At the pixel contact part, the upper surface of the second wiring 70 exposed by the removal of the flattening film 72 is covered with a transparent conductive film 74 made of ITO (indium tin oxide).

Subsequently, a third wiring 76 is provided in the same film as the transparent conductive film 74. In this embodiment, the third wiring 76 is provided as a three-film structure of Mo, Al and Mo and is used to form a peripheral lead wiring and a capacitance element provided additionally in the pixel. Covering the upper surface of the second wiring 70 exposed after the removal of the flattening film 72, with the transparent conductive film 74 as described above, also serves to protect the exposed surface of the second wiring 70 from the process of patterning the third wiring 76.

The upper surfaces of the transparent conductive film 74 and the third wiring 76 are first covered with a third silicon nitride film 78. Subsequently, near the pixel contact part of the transparent conductive film 74 in the display area 42, an opening is provided in the third silicon nitride film 78. A part of the upper surface of the transparent conductive film 74 is thus exposed. In this embodiment, an opening is also provided in the third silicon nitride film 78 in the frame area 44. The upper surface of the flattening film 72 is exposed through each opening.

Subsequently, the lower electrode 80 to be the pixel electrode is formed in such a way as to be connected to the upper surface of the transparent conductive film 74 exposed through the opening. In this embodiment, the lower electrode 80 is formed as a reflection electrode and has a multilayer structure including a transparent electrode made of a material such as IZO and a reflection metal made of a material such as Ag.

As shown in FIG. 3, at the pixel contact part, the transparent conductive film 74, the third silicon nitride film 78 and the lower electrode 80 form an added capacitance. Incidentally, at the time of patterning the lower electrode 80, the transparent conductive film 74 is partly exposed to the etching environment. However, due to annealing carried out after the process of forming the transparent conductive film 74 and before the process of forming the lower electrode 80, the transparent conductive film 74 has resistance to the etching of the lower electrode 80.

After the process of forming the lower electrode 80, an insulating film 82 to be the partition wall of the pixel area, called bank or rib, is formed. As the insulating film 82, photosensitive acrylic or the like is used as with the flattening film 72. It is preferable that the insulating film 82 has an opening to expose the upper surface of the lower electrode 80 as a light-emitting area and that the edge of the opening is gently tapered. If the edge of the opening is steeply tapered, it causes a coverage defect in an organic electroluminescence layer 100 which is formed later.

Figure 4:
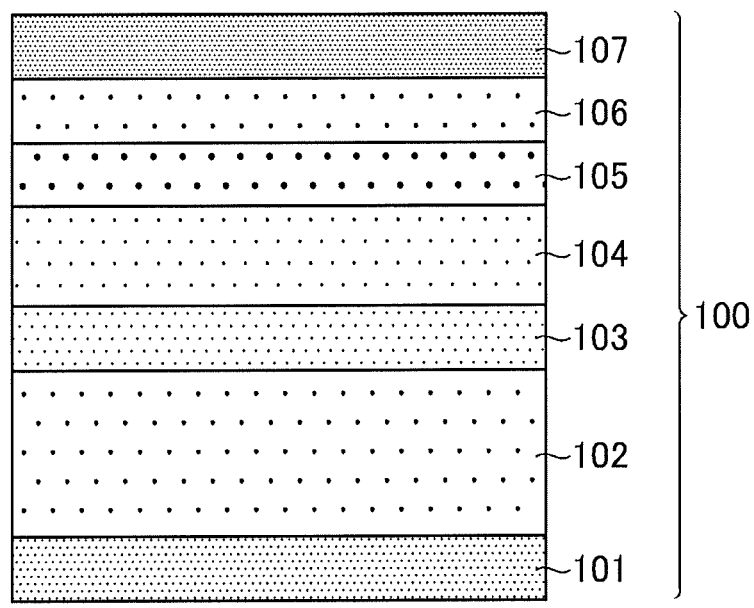
FIG. 4 is a schematic vertical cross-sectional view showing a multilayer structure of an organic electroluminescence layer in an opening provided in an insulating film in the embodiment.

After the insulating film 82 is formed, organic materials forming the organic electroluminescence layer 100 are stacked as multiple layers. FIG. 4 is a schematic vertical cross-sectional view showing the multilayer structure of the organic electroluminescence layer 100 in the opening provided in the insulating film 82 in this embodiment. In this embodiment, as shown in FIG. 4, as the multilayer structure forming the organic electroluminescence layer 100, a hole injection layer 101, a hole transport layer 102, an electron block layer 103, a light-emitting layer 104, a hole block layer 105, an electron transport layer 106 and an electron injection layer 107 are stacked in order from the side of the lower electrode 80. In this embodiment, the hole injection layer 101 is formed over a plurality of subpixels, whereas the hole transport layer 102 and the light-emitting layer 104 are formed for each subpixel.

Here, if the hole transport layer 102 formed for each subpixel is formed only in the opening in the insulating film 82 by a vapor deposition process using a mask, the thickness distribution of the hole transport layer 102 differs between a center area of the mask opening and an edge area of the mask opening, depending on the thickness of the mask. That is, the presence of the inner surface of the mask obstructs the vapor deposition of the hole transport layer 102 and therefore may cause the hole transport layer 102 to be thinner in the edge area of the mask opening than in the center area of the mask opening. Consequently, a current may tend to flow more easily in the edge area where the hole transport layer 102 is thinner. A method for solving this problem with the structure of the hole injection layer 101 in this disclosure will be described below.

Figure 5:
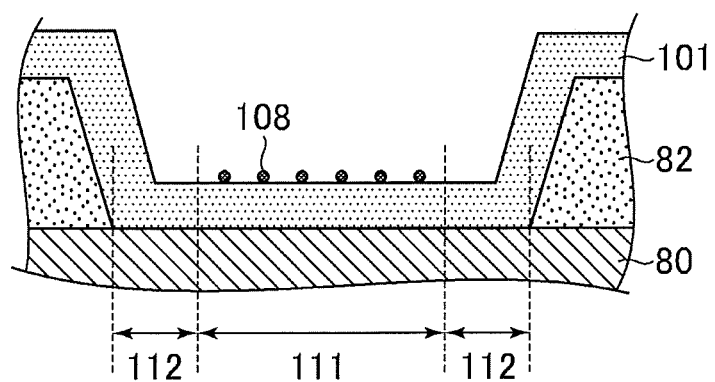
FIG. 5 is a schematic vertical cross-sectional view for explaining a process of forming a hole injection layer near the opening provided in the insulating film in the embodiment.

FIG. 5 is a schematic vertical cross-sectional view for explaining the process of forming the hole injection layer 101 near the opening provided in the insulating film 82. The opening provided in the insulating film 82 includes a first area 111 arranged on the center side and a second area 112 arranged on the outer side of the first area 111. In the example shown in FIG. 5, the hole injection layer 101 is formed from the opening provided in the insulating film 82 to the lateral surface and upper surface of the insulating film 82. That is, the hole injection layer 101 is formed in both of the first area 111 and the second area 112 of the opening.

The hole injection layer 101 is doped with a p-dopant. The molecules forming the hole injection layer 101 and the p-dopant interact and become charge-separated from each other, and thus generate holes and electrons. As the p-dopant, a material having a LUMO (Lowest Unoccupied Molecular Orbital) value that is close to the HOMO (Highest Occupied Molecular Orbital) of the hole injection layer 101 is desirable. For example, molybdenum oxide ($MoO_3$), rhenium oxide ($Re_2O_7$), F4-TCNQ or the like can be used.

Subsequently, the upper surface of the hole injection layer 101 in the first area 111 of the opening is additionally doped with a p-dopant 108, as shown in FIG. 5.

As a specific example of additional doping with the p-dopant 108, a mask having an opening equivalent to the opening in the insulating film 82 is arranged above the hole injection layer 101, and the p-dopant 108 is vapor-deposited on the upper surface of the hole injection layer 101 from above the mask. In this process, the amount of the p-dopant 108 deposited differs between a center area of the mask opening and an edge area of the mask opening. That is, the presence of the inner surface of the mask obstructs the vapor deposition of the p-dopant 108 and therefore causes the amount of the p-dopant 108 deposited to be smaller in the edge area than in the center area of the mask opening. Consequently, the amount of the p-dopant 108 deposited in the first area 111 on the upper surface of the hole injection layer 101 is greater than the amount of the p-dopant 108 deposited in the second area 112. While FIG. 5 shows a configuration in which the p-dopant 108 is deposited only in the first area 111 on the upper surface of the hole injection layer 101, a smaller amount of the p-dopant 108 than in the first area 111 may be additionally deposited in the second area 112 on the upper surface of the hole injection layer 101.

As another specific example of additional doping with the p-dopant 108, a mask having a smaller opening than the opening in the insulating film 82 may be arranged above the hole injection layer 101, and the p-dopant 108 may be vapor-deposited on the upper surface of the hole injection layer 101 from above the mask. Using the mask having a smaller opening than the opening in the insulating film 82, it is possible to, for example, deposit the p-dopant 108 only in the first area 111.

In this way, in the opening in the insulating film 82, the amount of additional doping with the p-dopant 108 in the first area 111 is made greater than the amount of additional doping with the p-dopant 108 in the second area 112. Employing such a manufacturing method enables a configuration in which the p-dopant concentration in the first area 111 is higher than the p-dopant concentration in the second area 112, in the hole injection layer 101 doped with the p-dopant 108.

With this configuration, the difference in the ease of flow of the current due to the difference between the thickness of the hole transport layer 102 in the second area 112 and the thickness of the hole transport layer 102 in the first area 111 can be offset by the difference in the ease of flow of the current due to the difference between the p-dopant concentration in the first area 111 and the p-dopant concentration in the second area 112. Thus, the occurrence of variation in luminance within the pixel can be restrained.

The problem that the thickness of the layer formed only in the opening in the insulating film 82 differs between the first area 111 and the second area 112 can occur also in other layers than the hole transport layer 102. For example, if a layer such as the light-emitting layer 104 is formed only in the opening in the insulating film 82, there is a similar problem. That is, the film can be formed less easily in the edge area near the inner surface of the mask opening used for the film forming process and the resulting film is thinner. Therefore, not only the difference in the thickness of the hole transport layer 102 between the first area 111 and the second area 112 but also the difference in the thickness of the entirety of the organic electroluminescence layer 100 between the first area 111 and the second area 112 may occur. The variation in luminance within the pixel due to the difference in the thickness of the entirety of the organic electroluminescence layer 100 between the first area 111 and the second area 112 can be controlled by the difference between the amount of doping with the p-dopant 108 in the first area 111 and the amount of doping with the p-dopant 108 in the second area 112, in the hole injection layer 101.

Another method for making the p-dopant concentration in the hole injection layer 101 in the first area 111 higher than the p-dopant concentration in the hole injection layer 101 in the second area 112 will be described below with reference to FIG. 6.

Figure 6:
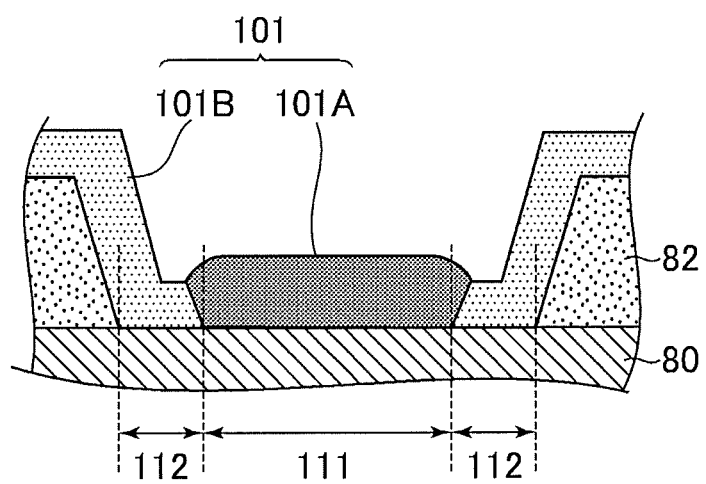
FIG. 6 is a schematic vertical cross-sectional view for explaining a process of forming a hole injection layer near the opening provided in the insulating film in the embodiment.

In the example shown in FIG. 6, the process of forming the hole injection layer 101 is carried out by two film forming processes.

Specifically, a second hole injection layer 101B is first formed from the second area 112 to the lateral surface and upper surface of the insulating film 82, as shown in FIG. 6. As a specific example of forming the second hole injection layer 101B, a mask for preventing vapor deposition in the first area 111 is arranged above the insulating film 82, and vapor deposition is then carried out. Thus, the second hole injection layer 101B can be formed from the second area 112 to the upper surface of the insulating film 82.

Next, a first hole injection layer 101A is formed in the first area 111, as shown in FIG. 6. As a specific example of forming the first hole injection layer 101A, a mask for preventing vapor deposition from the second area 112 to the upper surface of the insulating film 82 is arranged above the insulating film 82, and vapor deposition is then carried out. Thus, the first hole injection layer 101A can be formed in the first area 111.

Here, the p-dopant concentration in the first hole injection layer 101A is made higher than the p-dopant concentration in the second hole injection layer 101B. By such a manufacturing method, the p-dopant concentration in the hole injection layer 101 in the first area 111 can be made higher than the p-dopant concentration in the hole injection layer 101 in the second area 112.

In the example described above with reference to FIG. 6, the second hole injection layer 101B is formed first and the first hole injection layer 101A is formed later. Therefore, in this example, an edge part of the second hole injection layer 101B comes under an edge part of the first hole injection layer 101A at the boundary between the first area 111 and the second area 112, as illustrated. However, the first hole injection layer 101A may be formed first and the second hole injection layer 101B may be formed later. In such a case, an edge part of the first hole injection layer 101A comes under an edge part of the second hole injection layer 101B at the boundary between the first area 111 and the second area 112.

After the organic electroluminescence layer 100 is formed, an upper electrode 84 is formed. In this embodiment, since a top-emission structure is employed, the upper electrode 84 is formed using a transparent conductive material such as IZO (indium zinc oxide). According to the order of forming the organic electroluminescence layer 100, the lower electrode 80 is the anode and the upper electrode 84 is the cathode. The upper electrode 84, the organic electroluminescence layer 100 and the lower electrode 80 form the organic light-emitting diode 6. The lower electrode 80 of the organic light-emitting diode 6 is connected to the drive thin-film transistor 12.

After the upper electrode 84 is formed, a protection layer 90 is formed. One of the functions of the protection layer 90 is to prevent outside moisture from entering the organic electroluminescence layer 100, which is formed earlier. The protection layer 90 needs to have a high gas barrier property. In this embodiment, as the multilayer structure of the protection layer 90, a multi layer structure including a fourth silicon nitride film 92, an organic resin film 94 made of an acrylic resin or the like, and a fifth silicon nitride film 96 is employed. Also, a silicon oxide film may be provided between the organic resin film 94 and the fifth silicon nitride film 96.

A person skilled in the art can readily think of various changes and modifications within the technical scope of the invention. Such changes and modifications should be understood as being within the scope of the invention. For example, addition, deletion or design change of a component, or addition, omission or condition change of a process, made by a person skilled in the art to each of the embodiments, is included in the scope of the invention, provided that it has essential features of the invention.

Any advantageous effect that is different from the advantageous effects achieved by the embodiment but is clear from the description in this specification or can be readily thought of by a person skilled in the art is understood as brought about by the invention.

What is claimed is:

1. A display device comprising:
a substrate;
a lower electrode provided above the substrate;
an insulating film provided above the lower electrode and having an opening;
an organic layer arranged at least partly in the opening and electrically connected to the lower electrode; and
an upper electrode electrically connected to the organic layer, the organic layer being between the lower electrode and the upper electrode;
wherein the organic layer includes a hole injection layer,
the opening includes a first area arranged to a center side of the opening in a planar view, and a second area arranged on an outer side of the first area in a planar view, and
the hole injection layer has a higher p-dopant concentration in the first area than in the second area.

2. The display device according to claim 1, wherein the organic layer has a greater thickness in the first area than in the second area.

3. The display device according to claim 1, wherein the organic layer includes a hole transport layer, and the hole transport layer has a greater thickness in the first area than in the second area.

4. The display device according to claim 1, wherein the hole injection layer is provided from the opening to an upper surface of the insulating film.

5. The display device according to claim 1, wherein the hole injection layer includes:
a first hole injection layer provided in the first area in the opening; and
a second hole injection layer provided in the second area in the opening, and
the first hole injection layer has a first p-dopant concentration higher than a second p-dopant concentration of the second hole injection layer.

* * * * *